US012345571B2

(12) United States Patent
Kuo et al.

(10) Patent No.: US 12,345,571 B2
(45) Date of Patent: Jul. 1, 2025

(54) MICROELECTROMECHANICAL INFRARED SENSING DEVICE AND FABRICATION METHOD THEREOF

(71) Applicant: INDUSTRIAL TECHNOLOGY RESEARCH INSTITUTE, Hsinchu (TW)

(72) Inventors: Chin-Jou Kuo, Tainan (TW); Bor-Shiun Lee, New Taipei (TW); Ming-Fa Chen, Taoyuan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 545 days.

(21) Appl. No.: 17/729,873

(22) Filed: Apr. 26, 2022

(65) Prior Publication Data

US 2023/0045432 A1  Feb. 9, 2023

Related U.S. Application Data

(60) Provisional application No. 63/230,471, filed on Aug. 6, 2021.

(30) Foreign Application Priority Data

Jan. 19, 2022  (TW) .................................. 111102107

(51) Int. Cl.
*G01J 5/08* (2022.01)
*B81B 3/00* (2006.01)
(Continued)

(52) U.S. Cl.
CPC .......... *G01J 5/0815* (2013.01); *B81B 3/0021* (2013.01); *B81C 1/00476* (2013.01);
(Continued)

(58) Field of Classification Search
CPC ...... G01J 5/0815; G01J 5/0205; G01J 5/0225; G01J 5/20; B81B 3/0021;
(Continued)

(56) References Cited

U.S. PATENT DOCUMENTS 6,252,229 B1 * 6/2001 Hays ................... B81C 1/00269
250/338.4
6,828,172 B2 * 12/2004 Chavan .................. H10N 19/00
257/E27.008
(Continued)

FOREIGN PATENT DOCUMENTS

CN     102175329 A    9/2011
CN     106352989 A    1/2017
(Continued)

OTHER PUBLICATIONS

Zhang et al. "A flexible metamaterial absorber with four bands and two resonators" 2017.
(Continued)

*Primary Examiner* — Laura Martin
*Assistant Examiner* — Philip L Cotey
(74) *Attorney, Agent, or Firm* — Maschoff Brennan

(57) ABSTRACT

A MEMS infrared sensing device includes a substrate and an infrared sensing component. The infrared sensing component is provided above the substrate. The infrared sensing component includes a sensing plate and at least one supporting element. The sensing plate includes at least one infrared absorbing layer, an infrared sensing layer, a sensing electrode and a plurality of metallic elements. The sensing plate has a plurality of openings. The metallic elements respectively surround the openings. The sensing electrode is connected with the infrared sensing layer, and the metallic elements are spaced apart from one another. The supporting element connecting the sensing plate with the substrate.

20 Claims, 15 Drawing Sheets

(51) Int. Cl.
*B81C 1/00* (2006.01)
*G01J 5/02* (2022.01)
*G01J 5/20* (2006.01)

(52) U.S. Cl.
CPC ........... *G01J 5/0205* (2013.01); *G01J 5/0225* (2013.01); *G01J 5/20* (2013.01); *B81B 2201/0278* (2013.01); *B81B 2203/04* (2013.01); *B81C 2201/0105* (2013.01); *B81C 2201/0125* (2013.01)

(58) Field of Classification Search
CPC ........ B81B 2201/0278; B81B 2203/04; B81C 1/00476; B81C 2201/0105; B81C 2201/0125
See application file for complete search history.

(56) References Cited

U.S. PATENT DOCUMENTS

| | | | | |
|---|---|---|---|---|
| 7,459,686 | B2* | 12/2008 | Syllaios | G01J 3/0232 348/E5.09 |
| 7,491,938 | B2* | 2/2009 | Geneczko | H10F 39/193 250/339.02 |
| 9,029,783 | B2* | 5/2015 | Cannata | G01J 5/20 250/349 |
| 9,417,134 | B2* | 8/2016 | Koechlin | G01J 5/0853 |
| 9,705,015 | B2* | 7/2017 | Badano | H10F 71/00 |
| 10,451,487 | B1* | 10/2019 | Kennedy | G01J 5/06 |
| 10,488,358 | B2* | 11/2019 | Udrea | G01K 7/16 |
| 10,535,701 | B2* | 1/2020 | Zhang | H10F 39/184 |
| 2007/0170359 | A1* | 7/2007 | Syllaios | H04N 23/11 348/E5.09 |
| 2007/0170360 | A1* | 7/2007 | Gooch | G01J 5/20 250/338.1 |
| 2008/0035846 | A1* | 2/2008 | Talghader | G01J 5/08 250/338.1 |
| 2008/0237467 | A1* | 10/2008 | Oda | G01J 5/0215 250/338.3 |
| 2010/0155601 | A1* | 6/2010 | Cho | G01J 5/023 438/54 |
| 2011/0175145 | A1* | 7/2011 | Tsuji | H10F 39/193 257/470 |
| 2014/0254626 | A1* | 9/2014 | Maston | G01J 5/061 374/121 |
| 2015/0122999 | A1* | 5/2015 | Tsuchiya | G01J 5/0853 250/338.3 |
| 2015/0168221 | A1* | 6/2015 | Mao | H10N 10/8556 438/54 |
| 2016/0178444 | A1* | 6/2016 | Oulachgar | G01J 3/36 250/349 |
| 2017/0069768 | A1* | 3/2017 | Badano | H10F 77/407 |
| 2017/0329127 | A1* | 11/2017 | Liu | G01N 21/3581 |
| 2017/0343500 | A1* | 11/2017 | Udrea | G01K 7/16 |
| 2018/0297836 | A1* | 10/2018 | Liew | B81C 1/00317 |
| 2019/0323890 | A1* | 10/2019 | Jando | G01J 3/0297 |
| 2020/0072675 | A1* | 3/2020 | Jando | G01J 1/0411 |
| 2020/0109992 | A1* | 4/2020 | Le Rhun | G01J 5/068 |

FOREIGN PATENT DOCUMENTS

| | | |
|---|---|---|
| CN | 109459143 | 3/2019 |
| CN | 111795750 A | 10/2020 |
| TW | 201013942 A | 4/2010 |
| TW | 201023352 A | 6/2010 |
| TW | 201616105 | 5/2016 |
| TW | I595219 | 8/2017 |
| TW | M591173 | 2/2020 |

OTHER PUBLICATIONS

Zhang et al., "Broadband and wide angle near-unity absorption in graphene-insulator-metal thin film stacks" 2018.
Smith et al., "Enhanced performance of VOx-based bolometer using patterned gold black absorber" 2015.
Yuan "Study on Infrared Absorption Characteristics of Ti and TiNx Nanofilms" 2012.
Taiwan Office Action dated Dec. 27, 2022 as received in application No. 111102107.

* cited by examiner

MICROELECTROMECHANICAL INFRARED SENSING DEVICE AND FABRICATION METHOD THEREOF

CROSS-REFERENCE TO RELATED APPLICATIONS

This application claims priority under 35 U.S.C. § 119(a) on patent application Ser. No. 63/230,471 filed in U.S. on Aug. 6, 2021, and patent application Ser. No. 111102107 filed in Taiwan, R.O.C. on Jan. 19, 2022, the entire contents of which are hereby incorporated by reference.

BACKGROUND

1. Technical Field

The disclosure relates to a microelectromechanical (MEMS) infrared sensing device and a fabrication method of the same.

2. Related Art

In recent years, MEMS infrared sensors have been widely applied in various fields. The demand for MEMS infrared sensors will increase significantly in many fields in the future, such as industrial production, environmental monitoring, home care and temperature measurement. In general, a MEMS infrared sensor mainly includes an infrared absorbing layer and an infrared sensing layer. The infrared absorbing layer absorbs infrared radiation and converts the radiation energy into heat. Heat generated by the absorption of infrared radiation may cause a rise in the temperature of the infrared sensing layer, and such temperature change may lead to a change in electrical resistance of the infrared sensing layer. The change in electrical resistance can be then converted into a change in voltage or current, so that the temperature of an object can be measured by the MEMS infrared sensor.

Materials that can be used as infrared sensing layers need to have a high temperature coefficient of resistance (TCR), and thus available materials are restricted. At present, the materials commonly used as infrared sensing layer in this technical field are mainly capable of absorbing infrared light at the wavelength range of 10 to 14 microns (μm), while it cannot effectively utilize radiant energy generated by the infrared light at the wavelength range less than 10 μm. Specifically, silicon nitride, a material widely used for fabricating an infrared sensing layer in the industry, can absorb up to 85% of the infrared light at the wavelength range of 10 to 14 μm, but merely 55% of the infrared light at the wavelength range less than 10 μm.

SUMMARY

According to one embodiment of the disclosure, a MEMS infrared sensing device includes a substrate and an infrared sensing component provided above the substrate. The infrared sensing component includes a sensing plate and at least one supporting element. The sensing plate includes at least one infrared absorbing layer, an infrared sensing layer, a sensing electrode and a plurality of metallic elements. The sensing plate has a plurality of openings, the metallic elements respectively surround the openings, the sensing electrode is connected with the infrared sensing layer, and the metallic elements are spaced apart from one another. The supporting element connects the sensing plate with the substrate.

According to another embodiment of the disclosure, a method for fabricating MEMS infrared sensing device includes the following steps: forming a sacrificial layer on a substrate; forming at least one supporting element in the sacrificial layer; forming a sensing plate on the sacrificial layer; forming a plurality of openings in the sensing plate; and removing the sacrificial layer. The sensing plate includes at least one infrared absorbing layer, an infrared sensing layer, a sensing electrode and a plurality of metallic elements. The sensing electrode is connected with the infrared sensing layer and the at least one supporting element, and the metallic elements are spaced apart from one another. The openings penetrate the metallic elements, respectively.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
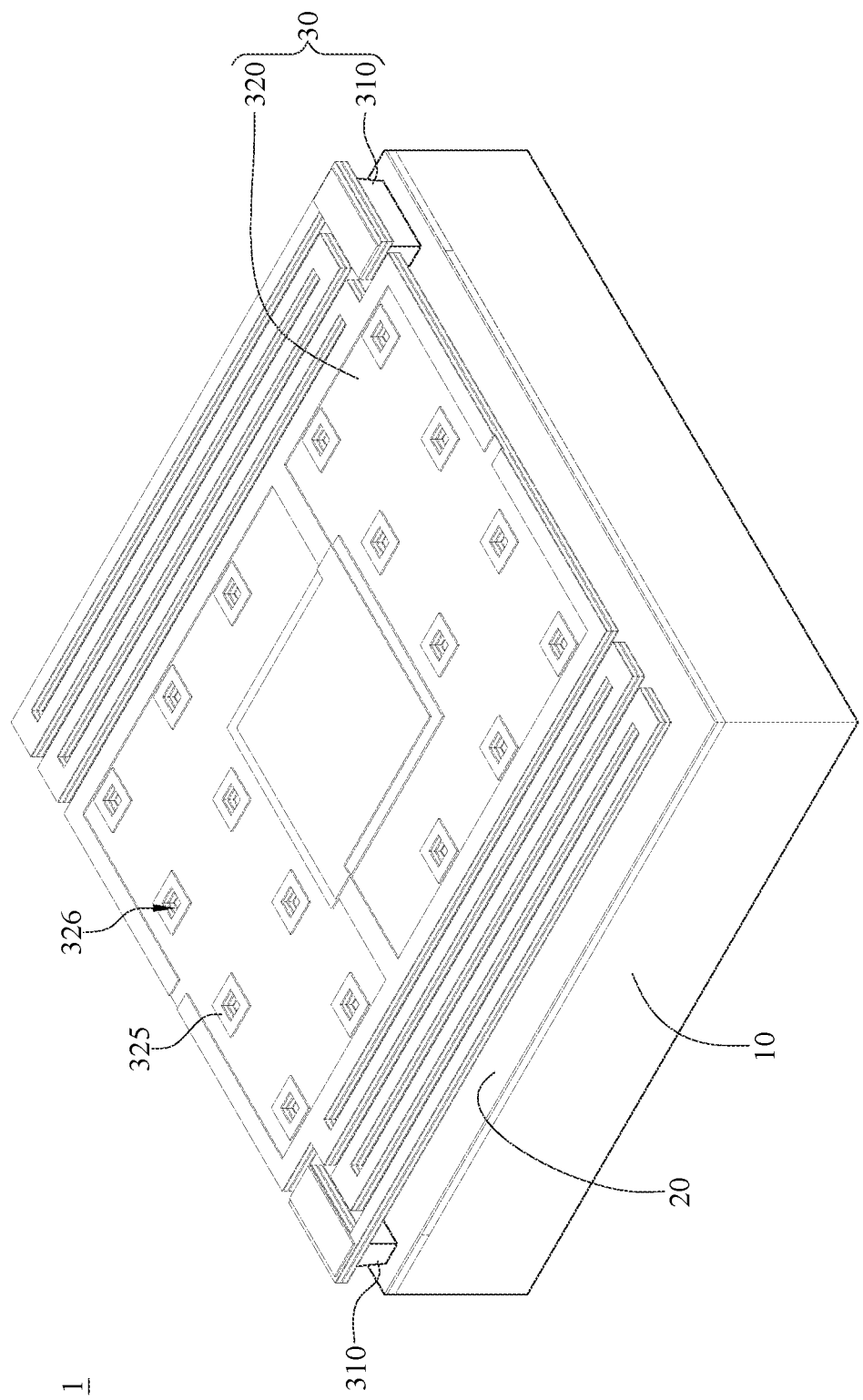
FIG. 1 is a perspective view of a MEMS infrared sensing device according to one embodiment of the disclosure.
Figure 2:
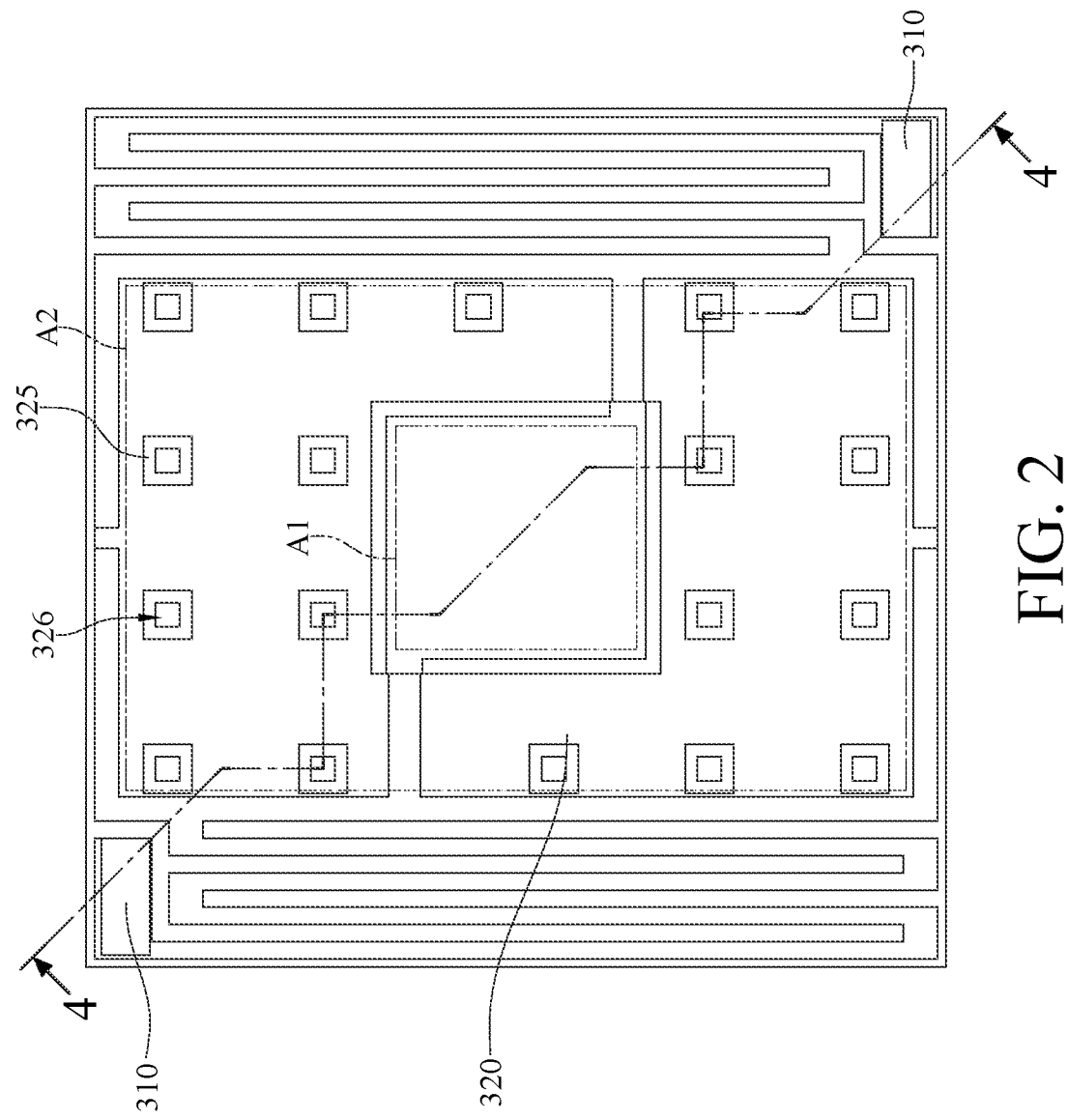
FIG. 2 is a top view of the MEMS infrared sensing device in FIG. 1.

Please refer to FIG. 1 and FIG. 2. FIG. 1 is a perspective view of a MEMS infrared sensing device according to one embodiment of the disclosure, and FIG. 2 is a top view of the MEMS infrared sensing device in FIG. 1. In this embodiment, a MEMS infrared sensing device 1 includes a substrate 10, an infrared reflective layer 20 and an infrared sensing component 30.

The substrate 10, for example but not limited to, is a silicon substrate including read-out circuit. The infrared reflective layer 20, for example but not limited to, is a metallic film provided on the substrate 10.

The infrared sensing component 30 is provided above the substrate 10, and the infrared reflective layer 20 is provided between the substrate 10 and the infrared sensing component 30. The infrared sensing component 30 includes at least one supporting element 310 and a sensing plate 320. The supporting element 310, for example but not limited to, is a metallic pillar located on the substrate 10, and the supporting element 310 is electrically connected with the read-out circuit in the substrate 10. The sensing plate 320 is suspended above the substrate 10 and the infrared reflective layer 20 by the supporting element 310. FIG. 1 exemplarily depicts a plurality of supporting elements 310 provided on the substrate 10, while the disclosure is not limited by the number of the supporting elements.

Figure 3:
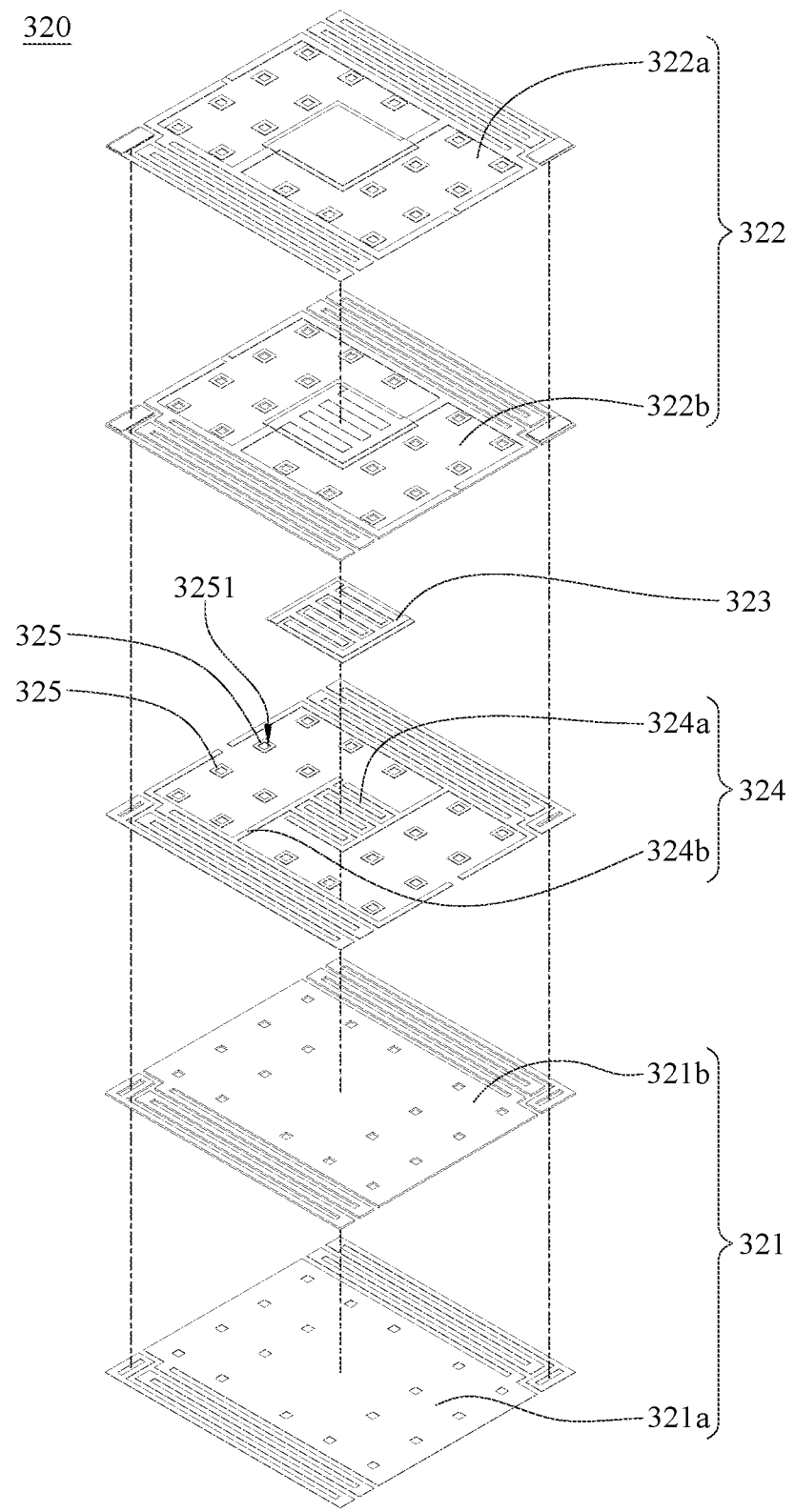
FIG. 3 is an exploded view of an infrared sensing component of the MEMS infrared sensing device in FIG. 1.
Figure 4:
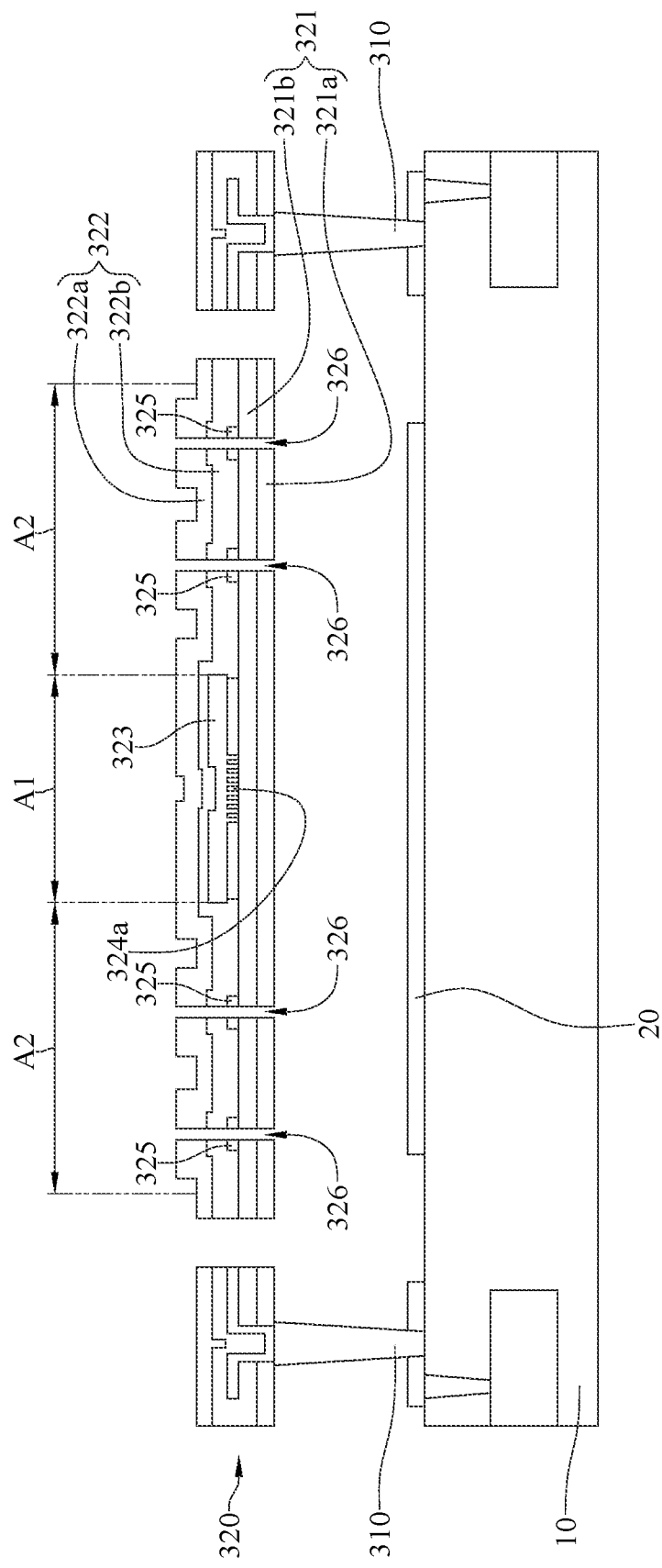
FIG. 4 is a cross-sectional view of the MEMS infrared sensing device in FIG. 1.

A sensing area A1 and an infrared absorbing area A2, which do not overlap each other, are defined on the sensing plate 320, and the infrared absorbing area A2 surrounds the sensing area A1. The sensing plate 320 includes a plurality of infrared absorbing layers, an infrared sensing layer 323, a sensing electrode 324 and a plurality of metallic elements 325. Please refer to FIG. 3 and FIG. 4. FIG. 3 is an exploded view of an infrared sensing component of the MEMS infrared sensing device in FIG. 1, and FIG. 4 is a cross-sectional view of the MEMS infrared sensing device in FIG. 1. In this embodiment, the sensing plate 320 includes a lower infrared absorbing layer 321 close to the infrared reflective layer 20 and an upper infrared absorbing layer 322 away from the infrared reflective layer 20.

The lower infrared absorbing layer 321 spreads over the sensing area A1 and the infrared absorbing area A2, and the lower infrared absorbing layer 321 includes a plurality of infrared absorbing sublayers. More specifically, the lower infrared absorbing layer 321 includes a first lower infrared absorbing sublayer 321a and a second lower infrared absorbing sublayer 321b between the infrared sensing layer 323 and the first lower infrared absorbing sublayer 321a, and the first lower infrared absorbing sublayer 321a and the second lower infrared absorbing sublayer 321b may be formed from different materials corresponding to different infrared spectrums. For example, the first lower infrared absorbing sublayer 321a is made of silicon oxide, the second lower infrared absorbing sublayer 321b is made of silicon nitride, and the two infrared absorbing sublayers has different infrared absorbance peaks.

The upper infrared absorbing layer 322 spreads over the sensing area A1 and the infrared absorbing area A2, and the upper infrared absorbing layer 322 includes a plurality of infrared absorbing layers. More specifically, the upper infrared absorbing layer 322 includes a first upper infrared absorbing sublayer 322a and a second upper infrared absorbing sublayer 322b between the infrared sensing layer 323 and the first upper infrared absorbing sublayer 322a, and the first upper infrared absorbing sublayer 322a and the second upper infrared absorbing sublayer 322b may be formed from different materials corresponding to different infrared spectrums. For example, the first upper infrared absorbing sublayer 322a is made of silicon oxide, the second upper infrared absorbing sublayer 322b is made of silicon nitride, and the two infrared absorbing sublayers has different infrared absorbance peaks.

That is, a combination of the lower infrared absorbing layer 321 with the upper infrared absorbing layer 322 may be a stacked structure with a symmetrical configuration with respect to the infrared sensing layer 323, and the infrared absorbing layers in each stacked structure may correspond to different infrared spectrums. In this embodiment, the first lower infrared absorbing sublayer 321a of the lower infrared absorbing layer 321 and the first upper infrared absorbing sublayer 322a of the upper infrared absorbing layer 322 have the same material (silicon oxide), and the second lower infrared absorbing sublayer 321b and the second upper infrared absorbing sublayer 322b have the same material (silicon nitride). The exemplary materials, such as silicon oxide and silicon nitride, as the infrared light absorbing sublayer in this embodiment are not intended to limit the disclosure. In some other embodiments, the infrared absorbing sublayer may be formed from other materials (for example, silicon oxide containing nitrogen) or a composite material, and each infrared absorbing layer may include a stack of more than two infrared absorbing sublayers.

In this embodiment, the lower infrared absorbing layer 321 and the upper infrared absorbing layer 322 have the same thickness. More specifically, the first lower infrared absorbing sublayer 321a and the first upper infrared absorbing sublayer 322a have the same thickness, and the second lower infrared absorbing sublayer 321b and the second upper infrared absorbing sublayer 322b have the same thickness.

Each of the lower infrared absorbing layer 321 and the upper infrared absorbing layer 322 in this embodiment consists of stack of multiple infrared absorbing sublayers, but the disclosure is not limited thereto. In some embodiments, each of the two infrared absorbing layers includes single material layer, or only one of the infrared absorbing layers includes stacked infrared absorbing sublayers. Moreover, the sensing plate 320 in this embodiment includes multiple infrared absorbing layers, but the disclosure is not limited thereto. In some embodiments, only single infrared absorbing layer may be formed above the infrared sensing layer or below the sensing electrode.

The infrared sensing layer 323 for example but not limited to, is formed from amorphous silicon (a-Si) or composite material with high temperature coefficient of resistance (TCR), and the infrared sensing layer 323 is provided between the lower infrared absorbing layer 321 and the upper infrared absorbing layer 322. The infrared sensing layer 323 is located in the sensing area A1 and does not extend into the infrared absorbing area A2.

The sensing electrode 324 electrically contacts the infrared sensing layer 323. In detail, the sensing electrode 324 is between the lower infrared absorbing layer 321 and the upper infrared absorbing layer 322, and the sensing electrode 324 includes an interdigitated electrode structure 324a located in the sensing area A1 and a linkage arm structure 324b located in the infrared absorbing area A2. The interdigitated electrode structure 324a electrically contacts the infrared sensing layer 323, and the interdigitated electrode structure 324a electrically contacts the supporting element 310 through the linkage arm structure 324b.

Figure 5:
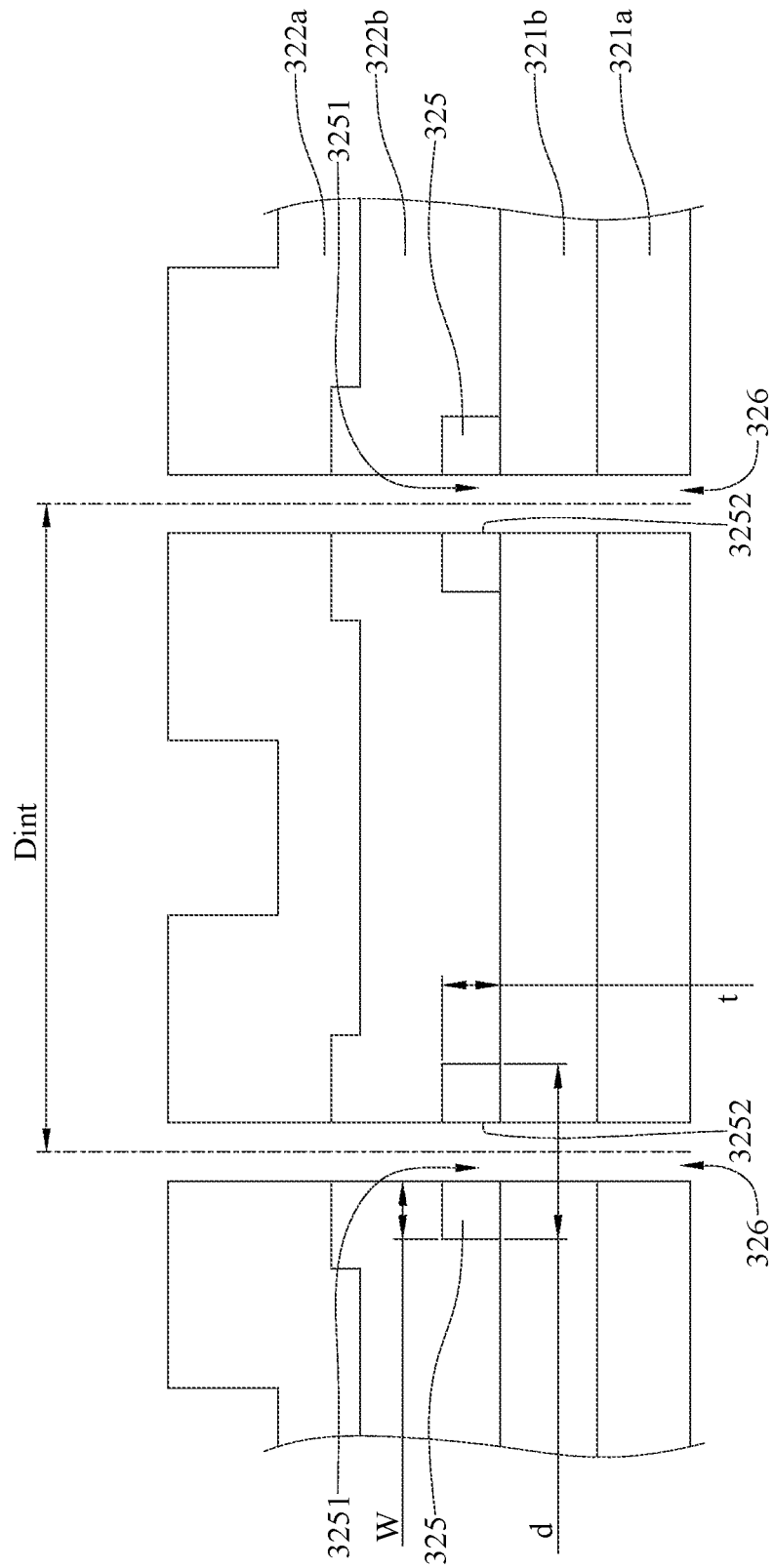
FIG. 5 is an enlarged view of part of the MEMS infrared sensing device in FIG. 4.

The metallic elements 325 are provided between the lower infrared absorbing layer 321 and the upper infrared absorbing layer 322, and the metallic elements 325 are spaced apart from one another. FIG. 5 is an enlarged view of part of the MEMS infrared sensing device in FIG. 4. The metallic elements 325 are located in the infrared absorbing area A2, and at least part of the metallic elements 325 are arranged periodically. The sensing electrode 324 and the metallic elements 325 are located at the same layer, and the sensing electrode 324 is electrically insulated from all of the metallic elements 325. The sensing plate 320 has a plurality of openings 326 corresponding to central apertures 3251 of the metallic elements 325, respectively, so that the metallic elements 325 surround respective openings 326. Each of the openings 326 penetrates through the sensing plate 320 by extending through the lower infrared absorbing layer 321, respective central aperture 3251 and the upper infrared absorbing layer 322. Each metallic element 325, for example, but not limited to, is a metallic ring, and an inner surface 3252 of the metallic ring form part of an inner wall of respective opening 326. Each metallic element 325 is ring in square shape in this embodiment, while it may be ring in circular or polygonal shape in some other embodiments.

The term "the metallic element surrounds the opening" described herein refers to a case that part of the opening is formed by the central aperture of the metallic element, and another case that an edge of the central aperture of the metallic element is spaced apart from the opening. An example of the former is shown in FIG. 4 and FIG. 5 where the central aperture 3251 is considered as part of the inner wall of the opening 326. An example of the latter is that the infrared absorbing layer is in a gap between the edge of the central aperture and the opening.

A method for fabricating the MEMS infrared sensing device 1 is described hereafter. Please refer to FIG. 6 through FIG. 13 showing schematic views of fabrication of the MEMS infrared sensing device in FIG. 1. The following discloses specific steps for fabricating the MEMS infrared sensing device 1, while said implementation in each step is not intended to limit the disclosure.

Figure 6:
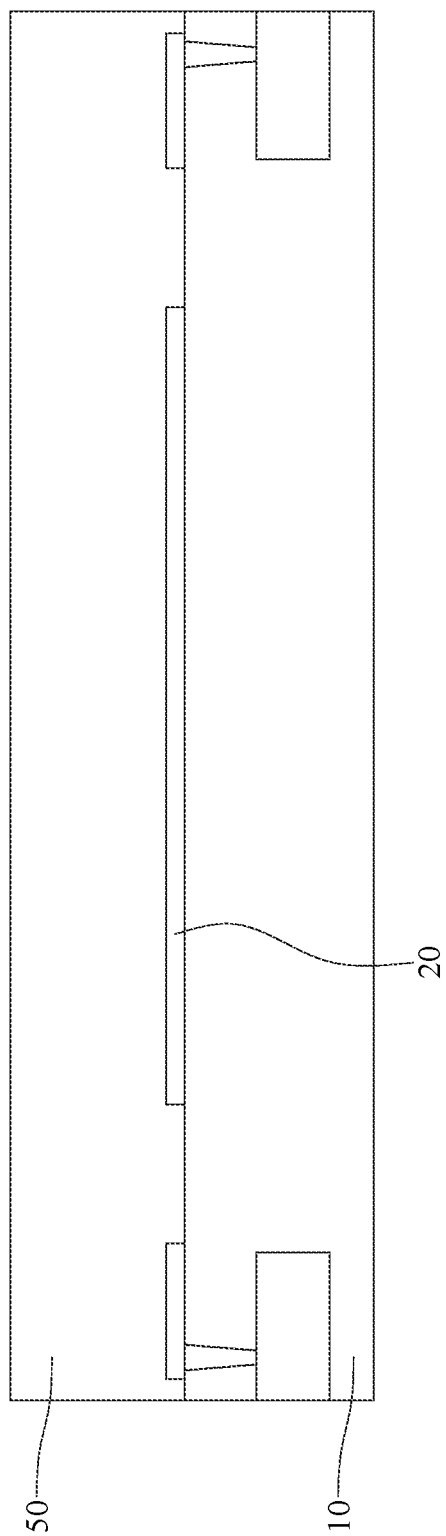
FIG. 6 through FIG. 13 are schematic views of fabrication of the MEMS infrared sensing device in FIG. 1.

As shown in FIG. 6, the substrate 10 including read-out circuit is provided, and the infrared reflective layer 20 and the sacrificial layer 50 are sequentially formed on the substrate 10. Specifically, a metallic layer (for example, a 300 nm thick aluminum layer) is deposited on the substrate 10, and the metallic layer is patterned by etching to thereby form the infrared reflective layer 20. After the formation of the infrared reflective layer 20, the sacrificial layer 50, such as a 1000-1500 nm thick a-Si layer, is deposited on the substrate 10 and the infrared reflective layer 20. Optionally, silicon oxide material (SiOx) may be formed on the infrared reflective layer 20 as a protective layer before the formation of the sacrificial layer 50.

Figure 7:
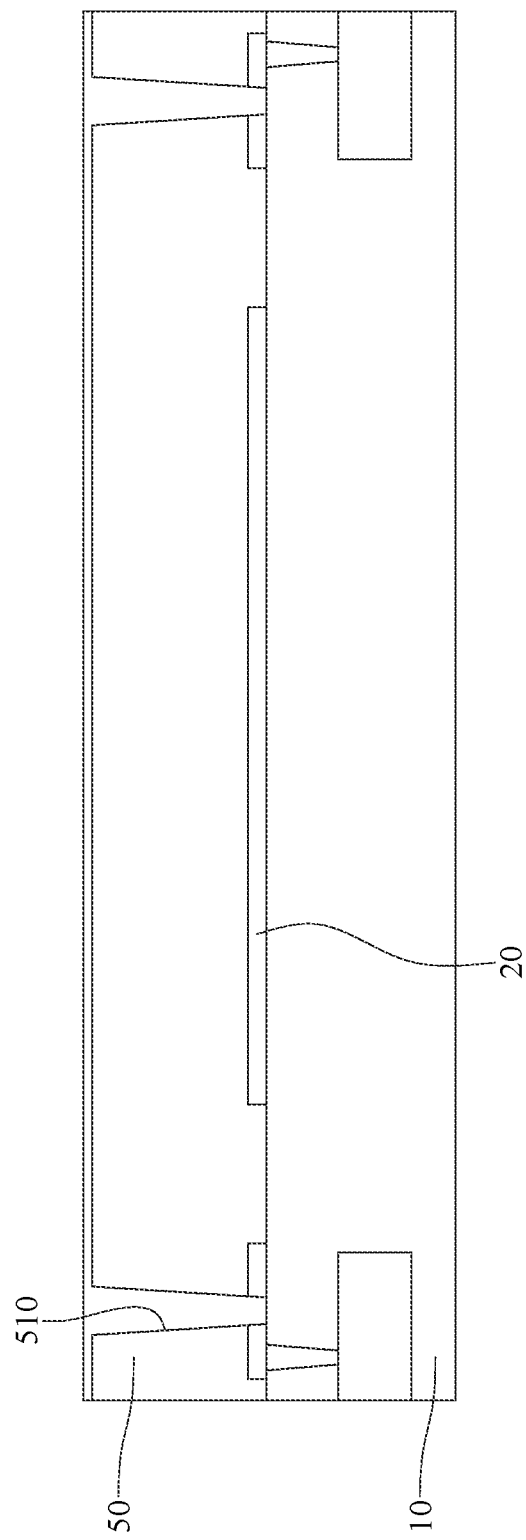
Figure 8:
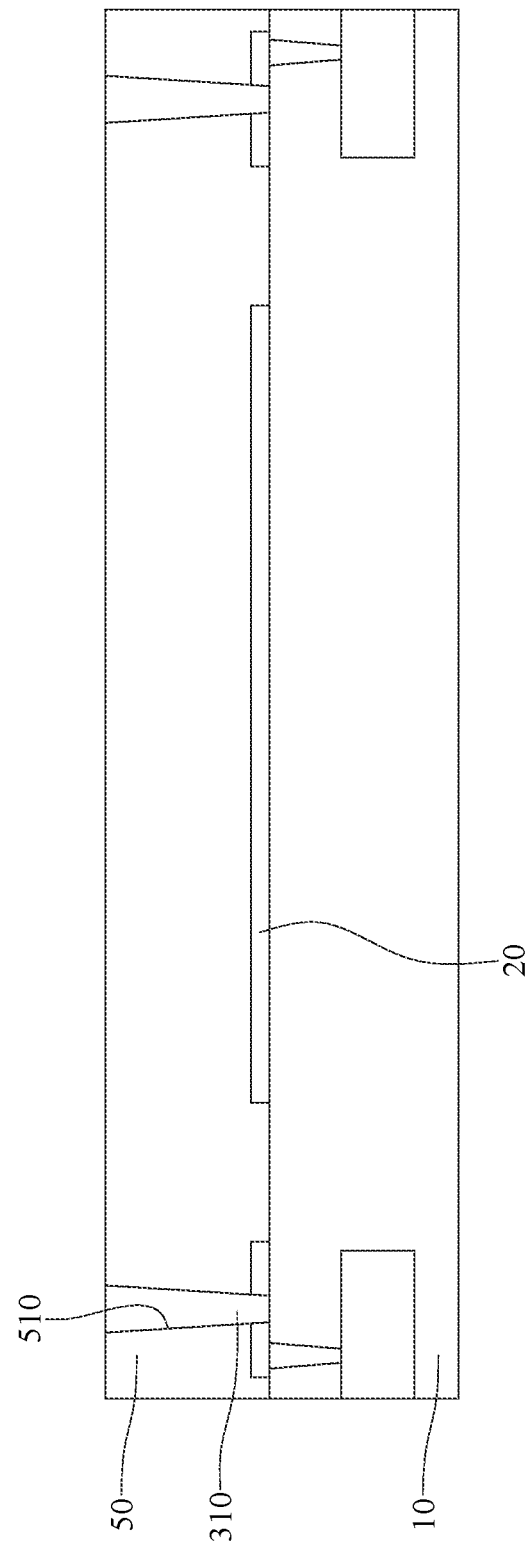

As shown in FIG. 7 and FIG. 8, the supporting elements 310 are formed in the sacrificial layer 50. Specifically, part of the sacrificial layer 50 is removed by etching to form through holes 510, and then the supporting elements 310 are formed in respective through holes 510. An electrically conductive material, such as tungsten, may be deposited on the top surface of the sacrificial layer 50 and in the through holes 510, and a portion of the electrically conductive material on the sacrificial layer 50 may be removed to form the supporting elements 310. More specifically, the electrically conductive material and the sacrificial layer 50 may be partially removed to form the supporting elements 310 by chemical mechanical planarization (CMP) in order to ensure a flat top surface of the sacrificial layer 50.

Figure 9:
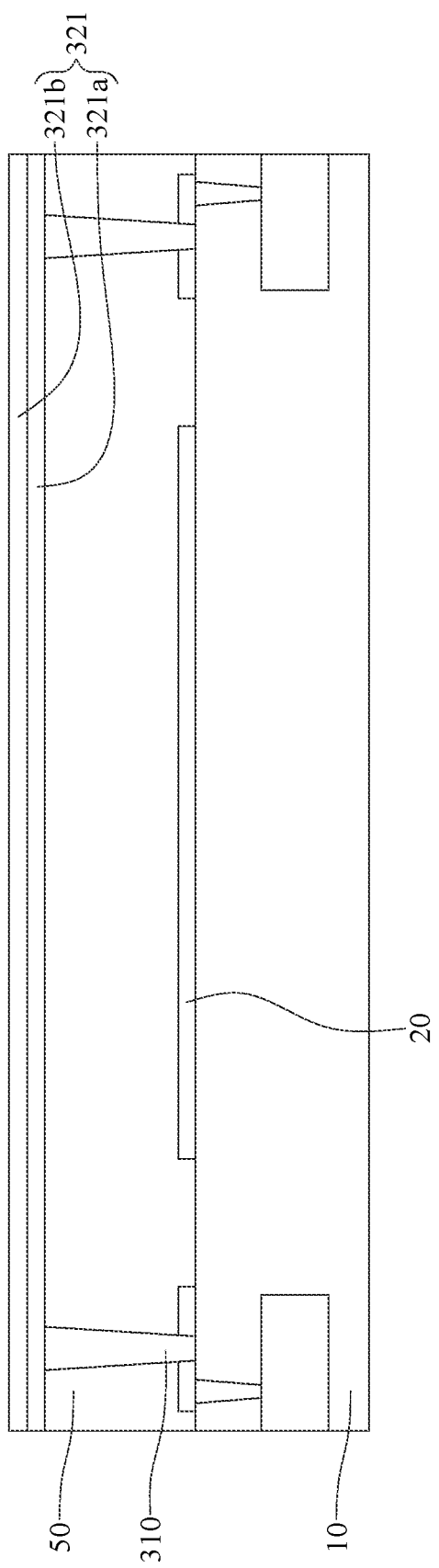

Next, the sensing plate 320 is formed on the sacrificial layer 50. As shown in FIG. 9, the lower infrared absorbing layer 321 of the sensing plate 320 is formed on the sacrificial layer 50. Specifically, a silicon oxide film of about 40~100 nm is firstly deposited on the supporting elements 310 and the sacrificial layer 50, and then a silicon nitride film of about 100~170 nm is deposited on the silicon oxide layer. The silicon oxide film and the silicon nitride film serve as the first lower infrared absorbing sublayer 321a and the second lower infrared absorbing sublayer 321b of the lower infrared absorbing layer 321, respectively.

Figure 10:
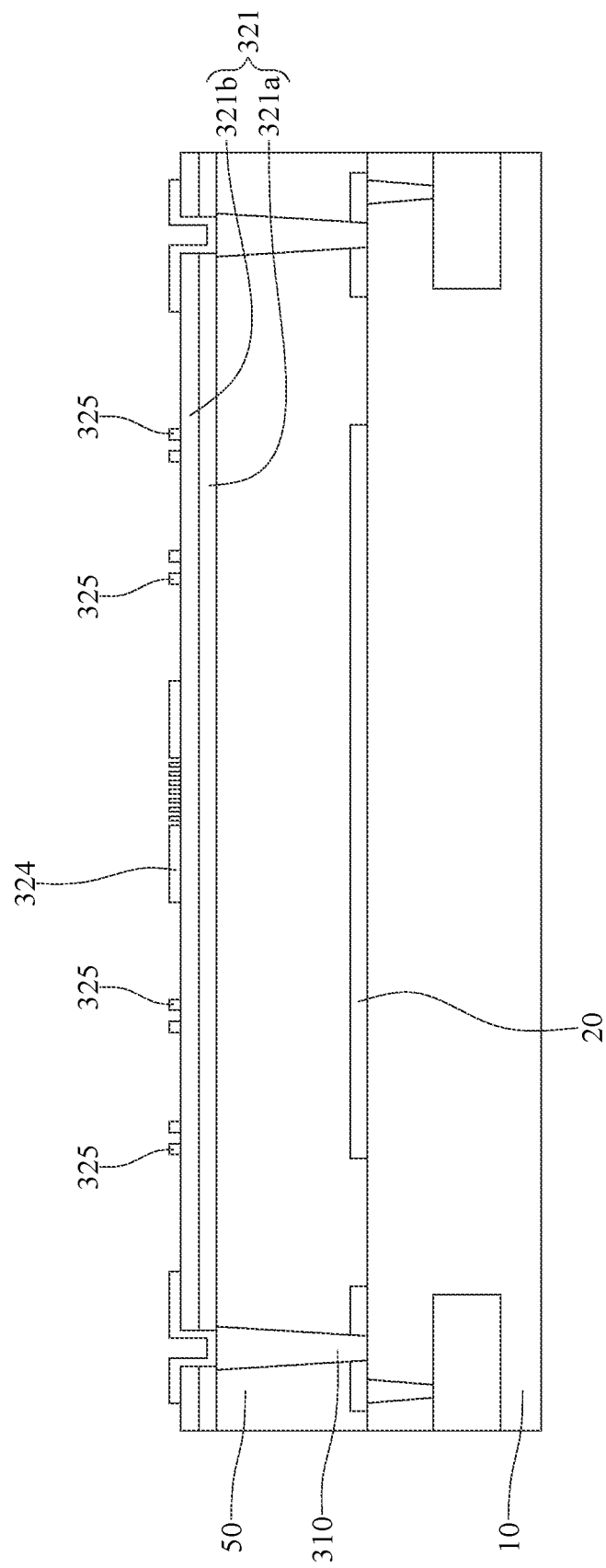

As shown in FIG. 10, the sensing electrode 324 and the metallic elements 325 of the sensing plate 320 are formed on the lower infrared absorbing layer 321. Specifically, after the formation of the lower infrared absorbing layer 321 by depositing the silicon oxide film and the silicon nitride film, the silicon oxide film and the silicon nitride film are partially removed by etching to expose the supporting elements 310; or, before the deposition of the silicon oxide film and the silicon nitride film, the supporting elements 310 are covered by a mask, so that the supporting elements 310 can expose to outside by removal of the mask after said deposition. Then, an electrically conductive layer, such as about 50-100 nm thick titanium nitride, is deposited on the top surface of the lower infrared absorbing layer 321 and the supporting elements 310, and the electrically conductive layer is patterned to form the sensing electrode 324 and the metallic elements 325. The patterning of the electrically conductive layer may be performed by photolithography process and/or etching process.

Referring to FIG. 5 and FIG. 10, an exemplary specification of the metallic elements 325 is as follows: a maximum diameter d of each metallic ring (that is, two times the radial length from the center of the metallic ring to the edge of the metal metallic) is from 1.3 to 1.5 a width W of the metallic ring is from 0.1 to 0.15 a thickness t of the metallic ring is from 50 to 70 nm, and a distance Dint between centers of pair of adjacent metallic rings is three times the maximum diameter d of the metallic ring.

Figure 11:
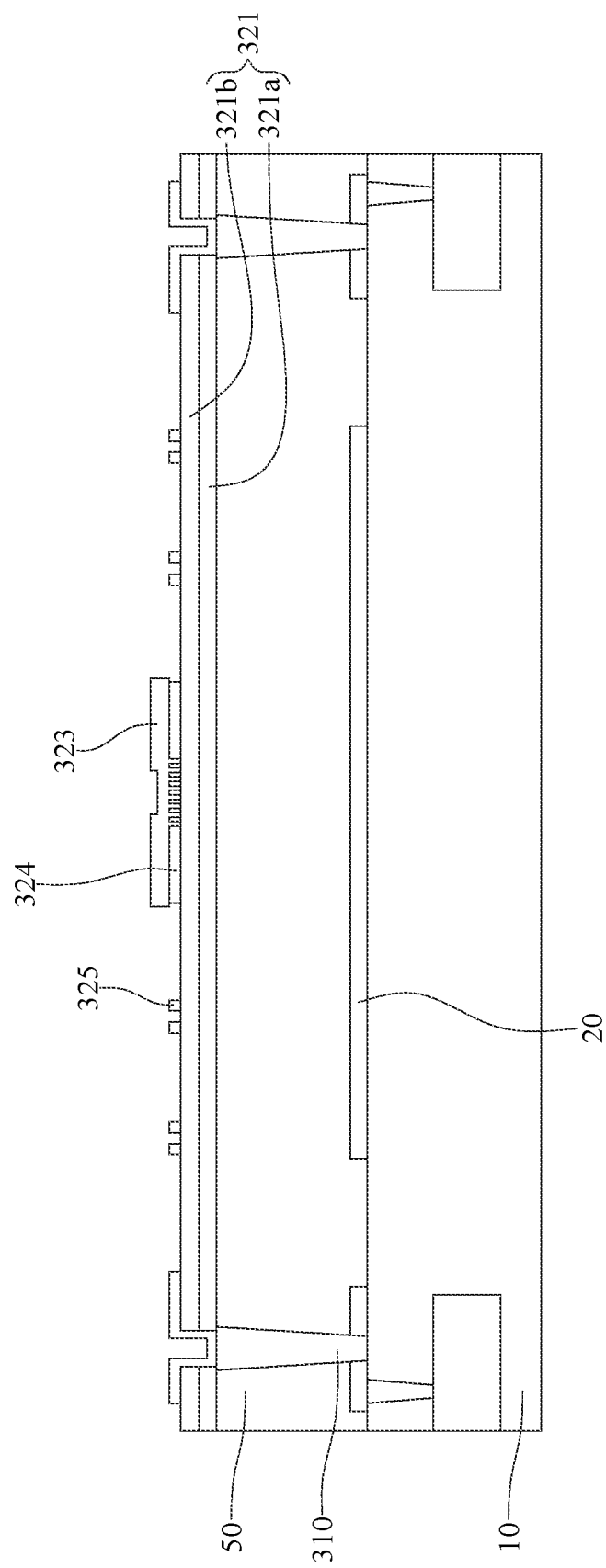

As shown in FIG. 11, the infrared sensing layer 323 of the sensing plate 320 is formed on the sensing electrode 324. Specifically, a material layer with high TCR, such as about 50-100 nm thick a-Si, is deposited on the sensing electrode 324, and then the material layer is patterned to form the infrared sensing layer 323 on the interdigitated electrode structure 324a of the sensing electrode 324. A region where the material layer is removed can be defined as the infrared absorbing area A2 of the sensing plate 320, and another region where the infrared sensing layer 323 and the interdigitated electrode structure 324a is located can be defined as the sensing area A1. In FIG. 10 and FIG. 11, the sensing electrode 324 is firstly formed and the infrared sensing layer 323 is then formed, but the disclosure is not limited thereto. In some embodiments, the infrared sensing layer may be firstly formed, followed by the formation of the sensing electrode. Besides, the patterning of the material layer may be performed by photolithography process and/or etching process.

Figure 12:
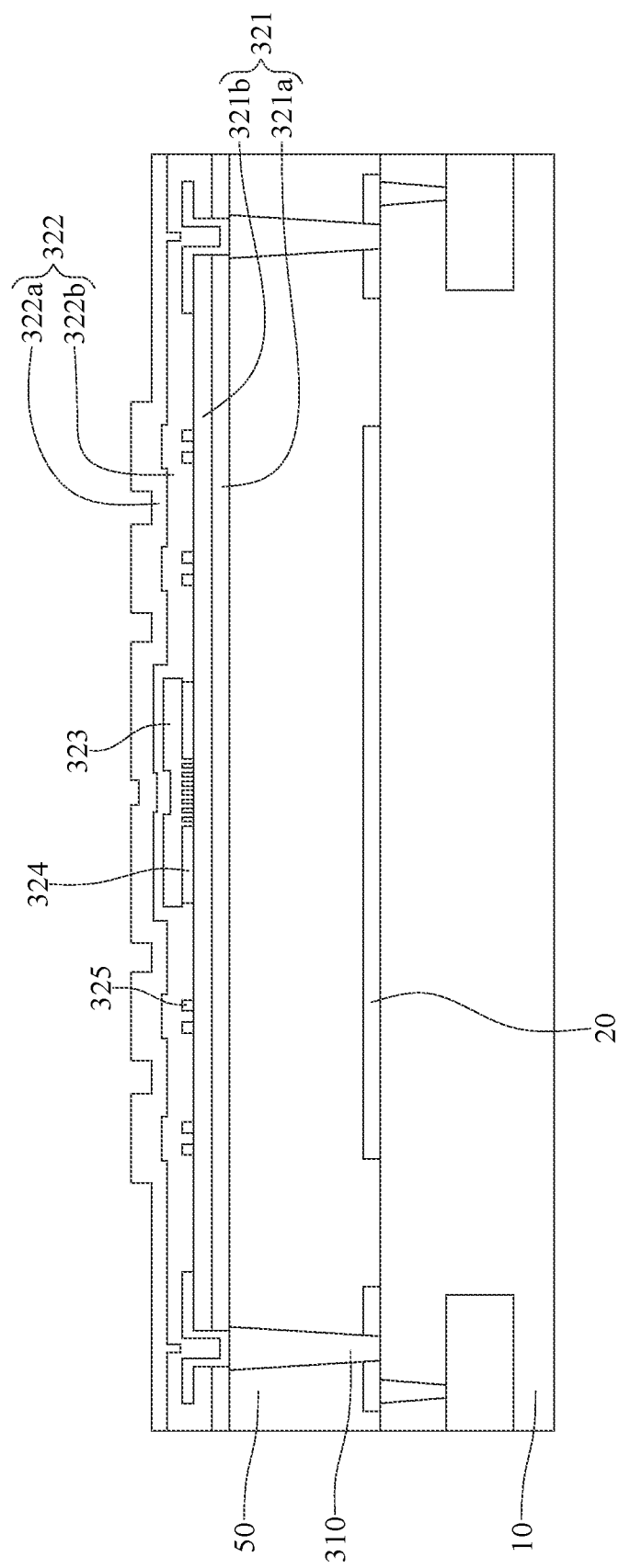

As shown in FIG. 12, the upper infrared absorbing layer 322 of the sensing plate 320 is formed on the infrared sensing layer 323. Specifically, a silicon nitride film of about 100~170 nm is firstly deposited on the infrared sensing layer 323 and the sensing electrode 324, and a silicon oxide film of about 40~100 nm is deposited on the silicon nitride film. Then, the silicon nitride film and the silicon oxide film are patterned to form the first upper infrared absorbing sublayer 322a and the second upper infrared absorbing sublayer 322b of the upper infrared absorbing layer 322. The patterning of the films may be performed by photolithography process and/or etching process.

Figure 13:
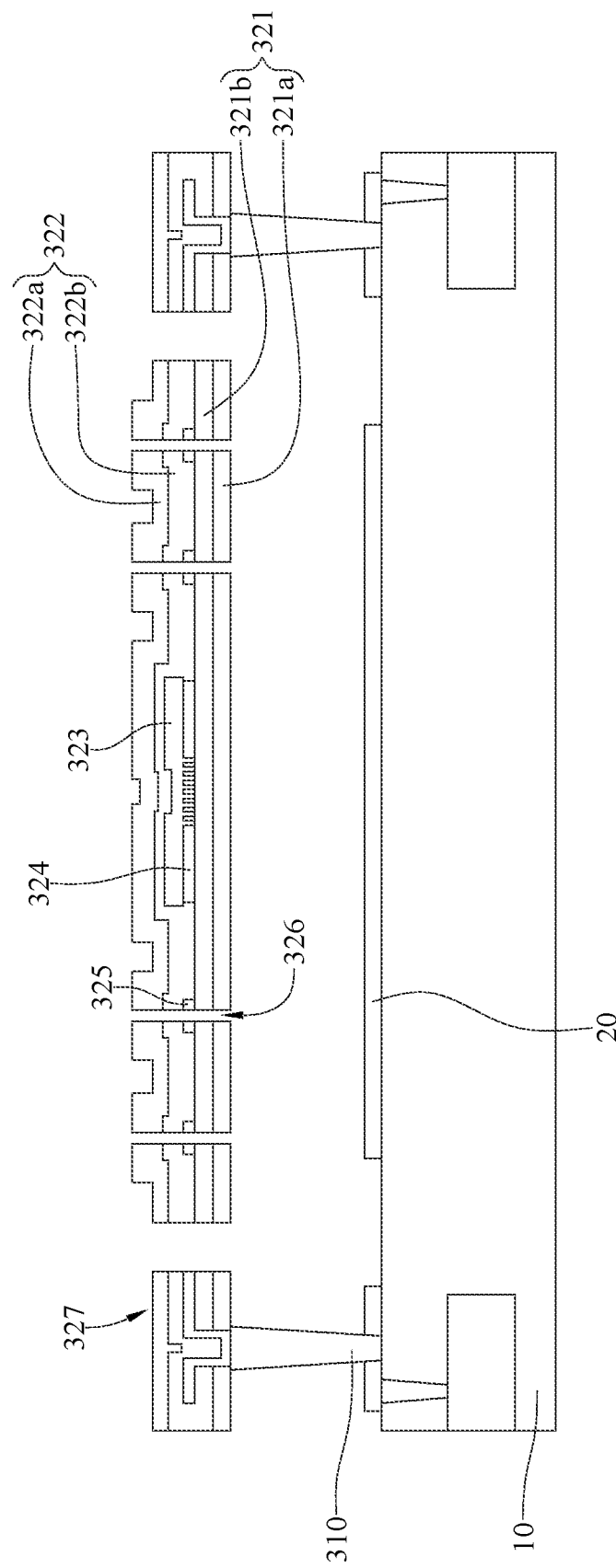

As shown in FIG. 13, part of the lower infrared absorbing layer 321, part of the upper infrared absorbing layer 322 and part of each metallic element 325 are removed to form the openings 326 and a resilient arm 327 of the sensing plate 320. The openings 326 penetrate the metallic elements 325, respectively. The sacrificial layer 50 is then removed by etching to form a gap between the lower infrared absorbing layer 321 and the infrared reflective layer 20.

When infrared light travels into the MEMS infrared sensing device 1, the radiant energy of infrared light passing through the sensing plate 320 can be absorbed by the lower infrared absorbing layer 321 and the upper infrared absorbing layer 322, and thus the temperature of the infrared sensing layer 323 rises. A rise in the temperature of the infrared sensing layer 323 leads to a change in its electrical resistance, which results in a change in an overall electrical resistance of the infrared sensing layer 323 and the sensing electrode 324 which is in electrical contact with each other, so that the read-out circuit in the substrate 10 can receive electrical signals (such as a change in voltage or a change in electrical current).

Figure 14:
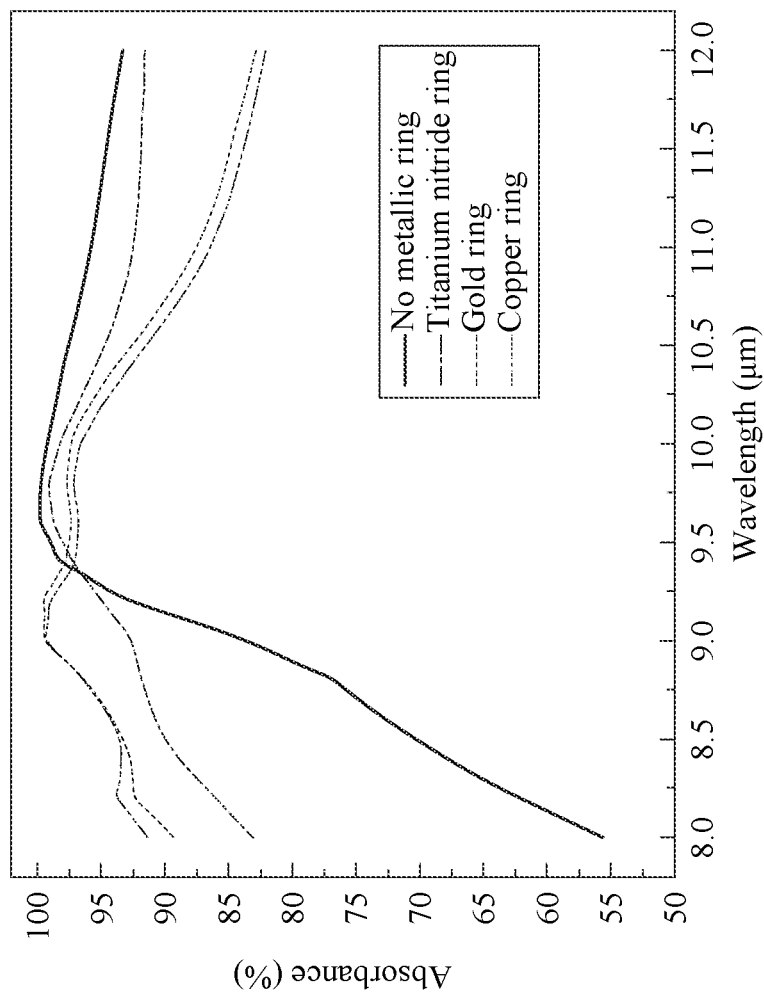
FIG. 14 is a graph showing infrared absorbance of MEMS infrared sensing devices with various metallic elements.

In this embodiment, the metallic elements 325 in the infrared absorbing area A2 and the corresponding opening 326 are helpful to increase infrared absorbance of the sensing plate 320 at the wavelength of 8 to 10 μm, preferably the wavelength of 8 to 9 μm. FIG. 14 is a graph showing infrared absorbance of MEMS infrared sensing devices with various metallic elements. According to a comparative embodiment, a sensing plate of a MEMS infrared sensing device without metallic element and opening expresses an infrared absorbance of about 55% at the wavelength of 8 μm. Compared to the sensing plate without metallic element and opening in the comparative embodiment, a sensing plate including multiple titanium nitride rings and openings enjoys higher infrared absorbance at the wavelength of 8 to 10 μm; in particular, the infrared absorbance at the wavelength of 8 μm increases by at least 25% (FIG. 14 shows the infrared absorbance at the wavelength of 8 μm increases from 55% to 82.5%, which represents an increase of 27.5%). In some other embodiments, it can be observed that the infrared absorbance can be increased by arranging metallic elements formed from different materials; for example, the infrared absorbance at the wavelength of 8 μm increases from 55% to 89% for a sensing plate including gold rings and openings, and increases from 55% to 91% for a sensing plate including copper rings and openings.

In this embodiment, each infrared absorbing structure (lower infrared absorbing layer 321 and upper infrared absorbing layer 322) includes multiple infrared absorbing sublayer for infrared absorption at various wavelength range. The infrared absorbing structure is helpful to increase infrared absorbance so as to increase a fill factor of the MEMS infrared sensing device 1. Also, the lower infrared absorbing layer 321 and the upper infrared absorbing layer 322, which are arranged symmetrically, may have the same or similar material properties (for example, thermal expansion coefficient or Young's modulus), configuration and size, so that unfavorable warpage or thermal stress in the sensing plate 320 can be prevented during the fabrication of the MEMS infrared sensing device 1, thereby improving manufacturing yield rate of the MEMS infrared sensing device 1.

Moreover, in this embodiment, the sensing electrode 324 includes the interdigitated electrode structure 324a, and the interdigitated electrode structure 324a enjoys small gap between adjacent electrodes and low electrical resistance compared to conventional electrode structure, so that the interdigitated electrode structure 324a can achieve sufficiently small noise equivalent temperature difference (NETD) for the requirements of compact as well as thermally sensitive MEMS infrared sensing device 1 by providing a smaller working area than conventional electrode structure. Meanwhile, due to a small working area of the interdigitated electrode structure 324a, the size of the infrared sensing layer 323, which should overlap the interdigitated electrode structure 324a, can also be reduced, which represents that the working area of the infrared absorbing layer for absorbing infrared light can be increased so as to further increase the fill factor of the MEMS infrared sensing device 1.

Furthermore, according to the fabrication method disclosed herein, since the lower infrared absorbing layer 321 of the sensing plate 320 is formed on the sacrificial layer 50 processed by CMP, a flat surface of the lower infrared absorbing layer 321 is provided at a side facing toward the infrared reflective layer 20 after removal of the sacrificial layer 50. The lower infrared absorbing layer 321 having flat bottom surface ensures a constant distance between the sensing plate 320 and the infrared reflective layer 20, thereby enabling the MEMS infrared sensing device 1 to achieve optimal sensing performance. The constant distance together with the symmetrical configuration of the infrared absorbing structure design can further improve manufacturing yield rate of the MEMS infrared sensing device 1.

FIG. 1 through FIG. 5 depict that the infrared sensing layer 323 has a smaller area than each of the upper infrared absorbing layer 322 and the lower infrared absorbing layer 321, and the openings 326 of the sensing plate 320 extend through the upper infrared absorbing layer 322 and the lower infrared absorbing layer 321 without extending through the infrared sensing layer 323, but the disclosure is not limited to the exemplary configuration.

Figure 15:
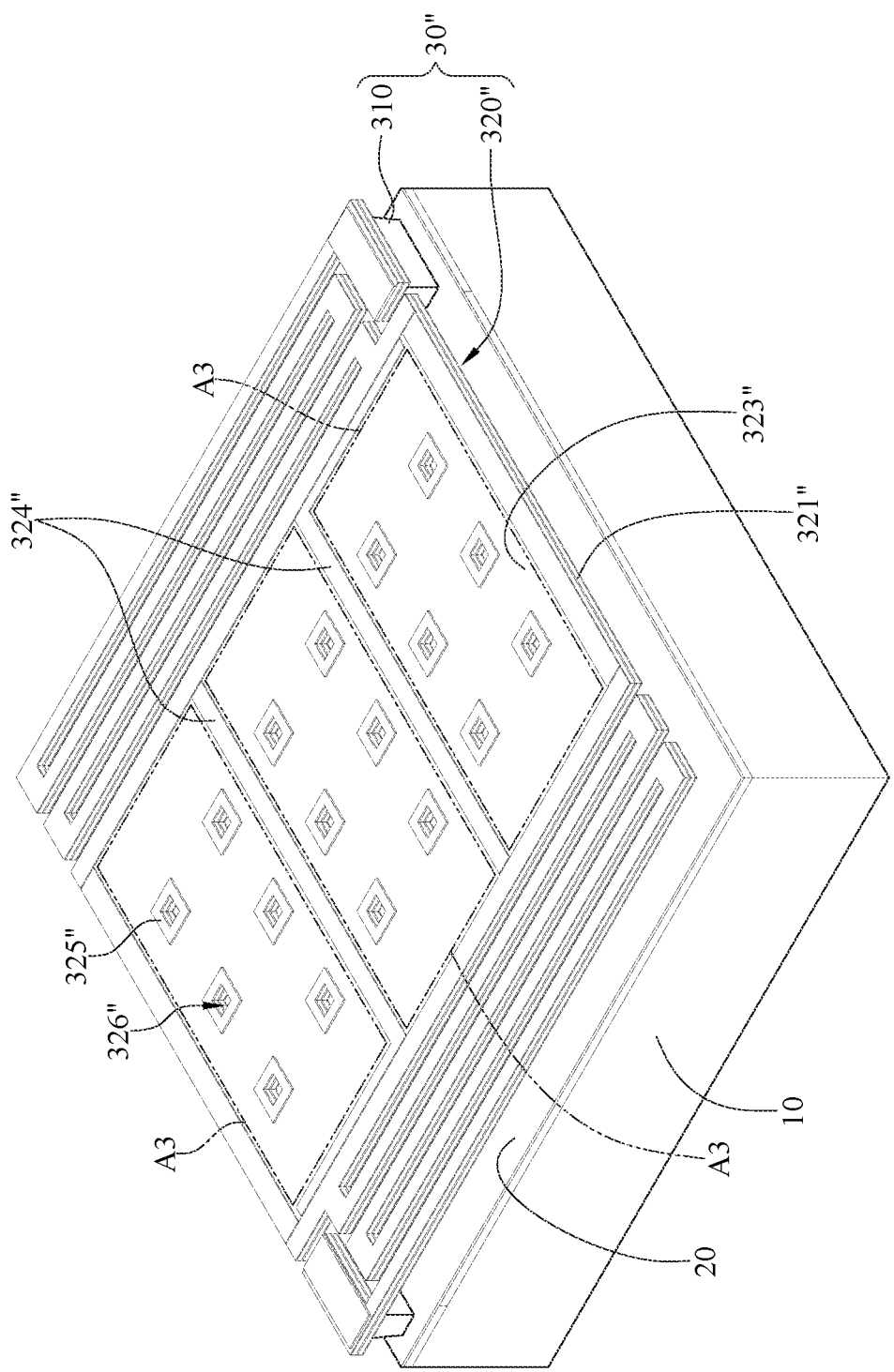
FIG. 15 is a perspective view of a MEMS infrared sensing device according to another embodiment of the disclosure.

FIG. 15 is a perspective view of a MEMS infrared sensing device according to another embodiment of the disclosure. In this embodiment, a MEMS infrared sensing device 2 includes a substrate 10, an infrared reflective layer 20 and an infrared sensing component 30". The infrared sensing component 30" includes a plurality of supporting elements 310 and a sensing plate 320", and the sensing plate 320" includes at least one infrared absorbing layer 321", an infrared sensing layer 323", a sensing electrode 324" and a plurality of metallic elements 325". The infrared sensing layer 323" is provided on the infrared absorbing layer 321" and spreads over the infrared absorbing layer 321". The sensing electrode 324" includes a plurality of branch electrodes. The openings 326" of the sensing plate 320" extend through the infrared sensing layer 323" and the infrared absorbing layer 321". Each of the metallic elements 325" is a metallic ring surrounding respective opening 326", and an inner surface of the metallic ring form part of an inner wall of respective opening 326".

In this embodiment, the metallic elements 325" and the openings 326" are distributed in the entire region on the sensing plate 320, wherein the metallic elements 325" are spaced apart from one another, and the openings are spaced apart from one another. In detail, as to a working area A3 defined by some branch electrodes of the sensing electrode 324", the infrared absorbing layer 321" and the infrared sensing layer 323" of the sensing plate 320" spread over the working area A3. After the formation of the infrared absorbing layer 321", the infrared sensing layer 323" and the metallic elements 325", the infrared sensing layer 323", the infrared absorbing layer 321" and each metallic element 325" are partially removed to form the openings 326". In any working area A3, both the metallic elements 325" and the openings 326" are arranged periodically at equal intervals. Besides, as shown in FIG. 15, a distance between adjacent metallic elements 325" which are located in different working areas A3 can be determined according to the width of the branch electrode of the sensing electrode 324".

According to the disclosure, in addition to the infrared absorbing layer, the sensing plate of the infrared sensing component further includes multiple metallic elements spaced apart from one another, and multiple openings surrounded by respective metallic elements. The metallic elements are helpful to increase infrared absorbance of the sensing plate at the wavelength of 8 to 10 μm, preferably the wavelength of 8 to 9 μm. The infrared absorbing layer, which itself has high infrared absorbance at the wavelength of 8 to 12 μm, working with the metallic elements enable a sensing component meeting the requirement of high infrared absorbance for a wide wavelength range.

It will be apparent to those skilled in the art that various modifications and variations can be made to the disclosure. It is intended that the specification and examples be considered as exemplary embodiments only, with a scope of the disclosure being indicated by the following claims and their equivalents.

What is claimed is:

1. A microelectromechanical (MEMS) infrared sensing device, comprising a substrate and an infrared sensing component provided above the substrate, and the infrared sensing component comprising:
   a sensing plate, comprising at least one infrared absorbing layer, an infrared sensing layer, a sensing electrode and a plurality of metallic elements, wherein the sensing plate has a plurality of openings, the metallic elements respectively surround the openings, the sensing electrode is connected with the infrared sensing layer, and the metallic elements are spaced apart from one another parallel to the substrate; and
   at least one supporting element connecting the sensing plate with the substrate.

2. The MEMS infrared sensing device according to claim 1, wherein a number of the at least one infrared absorbing layer is two, and the infrared sensing layer and the metallic elements are provided between the two infrared absorbing layers.

3. The MEMS infrared sensing device according to claim 2, wherein the openings extend through the infrared sensing layer and the two infrared absorbing layers, the openings are arranged periodically at equal intervals, and the metallic elements are arranged periodically at equal intervals.

4. The MEMS infrared sensing device according to claim 2, wherein the two infrared absorbing layers have same thickness.

5. The MEMS infrared sensing device according to claim 2, wherein at least one of the two infrared absorbing layers includes a plurality of infrared absorbing sublayers, and the infrared absorbing sublayers are formed from different materials.

6. The MEMS infrared sensing device according to claim 2, wherein the sensing electrode is provided between the two infrared absorbing layers, and the sensing electrode includes an interdigitated electrode structure.

7. The MEMS infrared sensing device according to claim 1, wherein each of the metallic elements is a metallic ring surrounding one of the openings, and an inner surface of the metallic ring form part of an inner wall of the opening.

8. The MEMS infrared sensing device according to claim 1, wherein the sensing plate of the infrared sensing component has a sensing area and an infrared absorbing area which do not overlap each other, the at least one infrared absorbing layer spreads over the sensing area and the infrared absorbing area, the infrared sensing layer is located in the sensing area and does not extend into the infrared absorbing area, and the metallic elements and the openings are located in the infrared absorbing area.

9. The MEMS infrared sensing device according to claim 8, wherein the openings are arranged periodically at equal intervals in the infrared absorbing area, and the metallic elements are arranged periodically at equal intervals in the infrared absorbing area.

10. The MEMS infrared sensing device according to claim 8, wherein a number of the at least one infrared absorbing layer is two, the infrared sensing layer and the metallic elements are provided between the two infrared absorbing layers, the openings extends through the two infrared absorbing layers without extending through the infrared sensing layer.

11. The MEMS infrared sensing device according to claim 1, wherein the sensing electrode defines a working area of the sensing plate, the at least one infrared absorbing layer and the infrared sensing layer spread over all of the working area, the metallic elements are spaced apart from one another in the working area, and the openings are spaced apart from one another in the working area.

12. The MEMS infrared sensing device according to claim 11, wherein the metallic elements are arranged periodically in the working area, and the openings are arranged periodically in the working area.

13. The MEMS infrared sensing device according to claim 1, wherein the sensing electrode and the metallic elements are located at the same layer, the sensing electrode electrically contacts the infrared sensing layer, and the sensing electrode is electrically insulated from the metallic elements.

14. A method for fabricating MEMS infrared sensing device, comprising:
   forming a sacrificial layer on a substrate;
   forming at least one supporting element in the sacrificial layer;
   forming a sensing plate on the sacrificial layer, wherein the sensing plate includes at least one infrared absorbing layer, an infrared sensing layer, a sensing electrode and a plurality of metallic elements, the sensing electrode is connected with the infrared sensing layer and the at least one supporting element, and the metallic elements are spaced apart from one another parallel to the substrate;
   forming a plurality of openings in the sensing plate, wherein the openings penetrate the metallic elements respectively; and
   removing the sacrificial layer.

15. The method according to claim 14, wherein the step of forming the openings in the sensing plate comprises:
   removing part of the infrared sensing layer, part of the at least one infrared absorbing layer and part of each of the metallic elements to form the openings.

16. The method according to claim 14, wherein the step of forming the openings in the sensing plate comprises:
   removing part of the at least one infrared absorbing layer and part of each of the metallic elements to form the openings, and the openings do not extend through the infrared sensing layer.

17. The method according to claim 14, wherein the step of forming the at least one supporting element in the sacrificial layer comprises:
   forming a plurality of through holes in the sacrificial layer;
   filling an electrically conductive material in the through holes; and
   removing part of the electrically conductive material to form the at least one supporting element.

18. The method according to claim 17, wherein the electrically conductive material is removed by chemical mechanical planarization.

19. The method according to claim 14, wherein the step of forming the sensing plate on the sacrificial layer comprises:
   forming a lower infrared absorbing layer of the at least one infrared absorbing layer on the sacrificial layer;
   removing part of the lower infrared absorbing layer to expose the at least one supporting element;
   depositing an electrically conductive layer on the lower infrared absorbing layer and the at least one supporting element;
   patterning the electrically conductive layer to form the sensing electrode and the metallic elements; and forming the infrared sensing layer on the sensing electrode.

20. The method according to claim 19, wherein the step of forming the sensing plate on the sacrificial layer further comprises:

forming an upper infrared absorbing layer on the infrared sensing layer and the lower infrared absorbing layer.

* * * * *